(12) United States Patent
Ozkan et al.

(10) Patent No.: US 12,721,202 B2
(45) Date of Patent: Aug. 25, 2026

(54) DEFORMABLE SEMICONDUCTOR DEVICE CONNECTION

(71) Applicant: Intel Corporation, Santa Clara, CA (US)

(72) Inventors: Onur Ozkan, Scottsdale, AZ (US); Edvin Cetegen, Chandler, AZ (US); Steve Cho, Chandler, AZ (US); Nicholas S Haehn, Scottsdale, AZ (US); Jacob Vehonsky, Gilbert, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 431 days.

(21) Appl. No.: 17/479,854

(22) Filed: Sep. 20, 2021

(65) Prior Publication Data

US 2023/0086180 A1 Mar. 23, 2023

(51) Int. Cl.
*H10W 72/00* (2026.01)

(52) U.S. Cl.
CPC .................................. *H10W 72/00* (2026.01)

(58) Field of Classification Search
CPC ...................................................... H01L 24/72
USPC ......................................................... 257/689
See application file for complete search history.

(56) References Cited

U.S. PATENT DOCUMENTS 9,583,470 B2 2/2017 Karhade et al.
2005/0194695 A1 9/2005 Lin et al.
2012/0038061 A1 2/2012 Su et al.
2012/0252168 A1* 10/2012 Nah .................... H01L 21/4853 257/E21.502
2013/0252383 A1 9/2013 Chen
2013/0307146 A1* 11/2013 Osumi .................... H01L 24/13 257/737
2014/0065771 A1* 3/2014 Gruber ................. H05K 3/3436 257/E21.506
2014/0299986 A1 10/2014 Sakurai et al.
2017/0077053 A1* 3/2017 Keser ...................... H01L 24/46
2018/0122761 A1* 5/2018 Huang .................... H01L 24/03
2020/0098692 A1* 3/2020 Liff ..................... H01L 23/5386

OTHER PUBLICATIONS

EPO European Extended Search Report in EP Application Serial No. 22189545.1 mailed on Jun. 16, 2023, 17 pages.

* cited by examiner

*Primary Examiner* — Ajay Arora
(74) *Attorney, Agent, or Firm* — Alliance IP, LLC

(57) ABSTRACT

A semiconductor device may include a first plate-like element having a first substantially planar connection surface with a first connection pad and a second plate-like element having a second substantially planar connection surface with a second connection pad corresponding to the first connection pad. The device may also include a connection electrically and physically coupling the first and second plate-like elements and arranged between the first and second connection pads. The connection may include a deformed elongate element arranged on the first connection pad and extending toward the second connection pad and solder in contact with the second connection pad and the elongate element.

20 Claims, 6 Drawing Sheets

MAX. ASSEMBLY WINDOW

MAX. ASSEMBLY WINDOW

MAX. ASSEMBLY WINDOW

MAX. ASSEMBLY WINDOW
102
114
106
108
114
104

MAX. ASSEMBLY WINDOW
102
114
106
108
114
104

MAX. ASSEMBLY WINDOW
102
114
106
108
114
104
120

DEFORMABLE SEMICONDUCTOR DEVICE CONNECTION

TECHNICAL FIELD

Embodiments described herein generally relate to electrical interconnections in microelectronic devices. Selected examples include semiconductor devices having connection elements in connection arrays that have particular pre-assembled and post-assembled shapes and material selections to improve manufacturing yield. Still further selected examples include semiconductor devices with elongate and/or pillar-shaped bumps that may function to increase an assembly window providing for higher tolerances for semiconductor dies and substrates.

BACKGROUND

Microelectronic devices may include ball grid arrays or other types of solder arrays used to connect the dies to substrates such as power supply boards or other substrates. The connections may be made using thermal compression bonding, for example. Pressures to decrease the size of solder pads and to increase the density of the pads lend themselves toward smaller and smaller bumps. Lack of uniformity (e.g., flatness) of dies and substrates can create situations where bumps are spread too much in a thermal compression bonding process causing lateral contact between the bumps and a short from one connection to another. The opposite problem can also occur, where no vertical contact is made between the bumps leaving an opening in the circuit.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present application, in one or more embodiments, relates to an electronic connection having bumps in connection arrays that have particular pre-assembled and/or post-assembled shapes and material selections to improve manufacturing yield. Still further selected examples include semiconductor devices with elongate and/or pillar-shaped bumps that may function to increase an assembly window providing for higher tolerances for semiconductor dies and substrates. That is, one side of a connection (e.g., a die side or a substrate side) may include elongate and/or pillar-shaped bumps in lieu of hemispherical bumps. The elongate and/or pillar-shaped bumps may allow for a wider distance between dies and substrates to result in a connection due to the height provided. Moreover, the elongate and/or pillar-shaped bumps may be adapted to deform in particular circumstances to accommodate the low-gap end of the assembly window. As such, the elongate or pillar-shaped bumps may assist in contacting the opposing surface in large gap conditions while still accommodating low gap conditions. This design may be advantageous by providing a larger assembly window and increasing yield of integrated circuit products.

Figure 1:
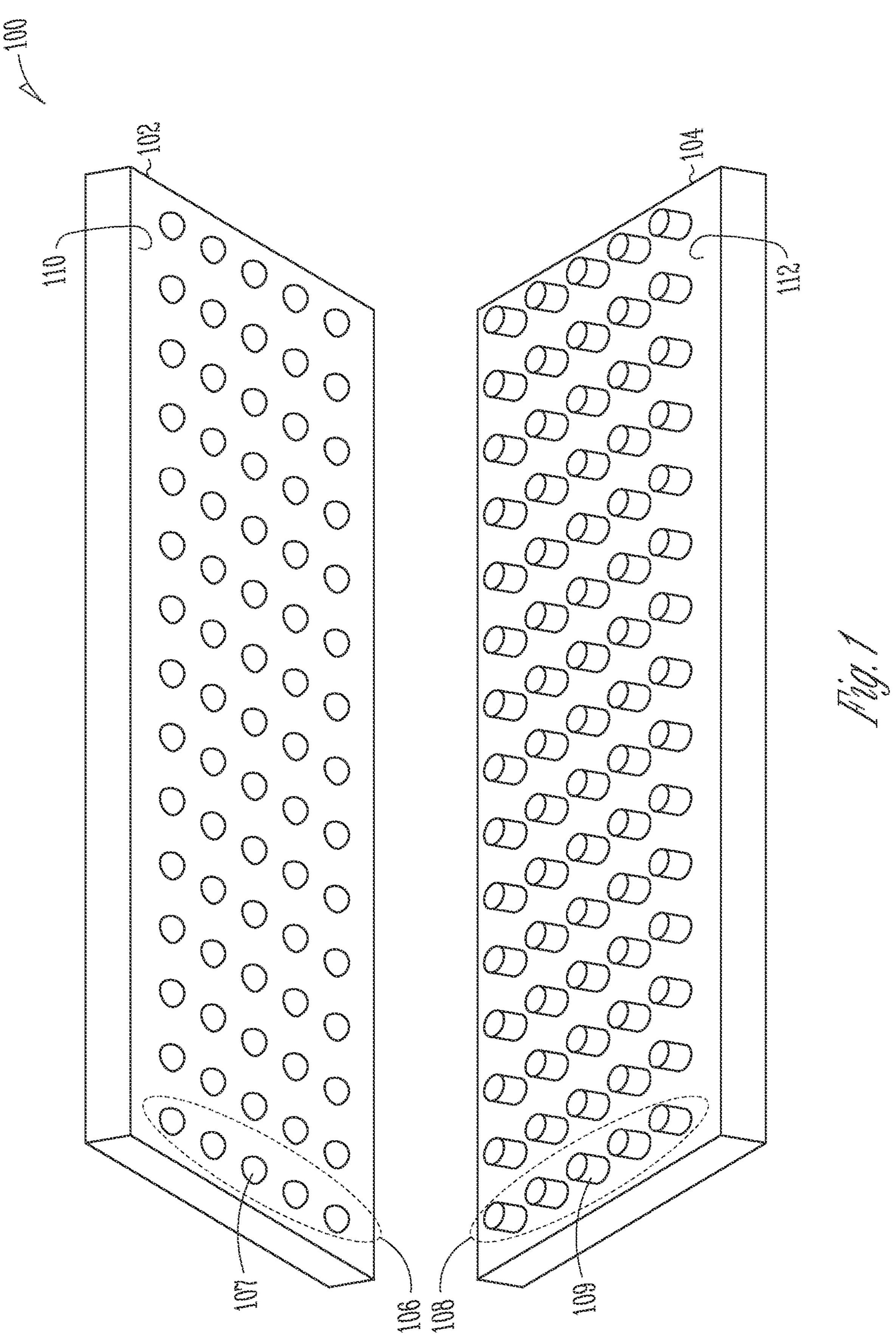
FIG. 1 is a perspective view of first and second plate-like elements each having a connection array, according to one or more embodiments.

FIG. 1 includes a perspective view of a semiconductor device 100 poised for assembly. The semiconductor device may be configured for performing computer processing. For example, the semiconductor device may include a computer die or die package and a circuit board. In any case, and as shown in FIG. 1, the semiconductor device may include first and second plate-like elements 102/104 connected to one another by way of corresponding arrays of connection elements 106/108. In FIG. 1, the first and second plate-like elements 102/104 are poised for assembly and the correspondence between the connection elements 106/108 is shown.

Figure 2:
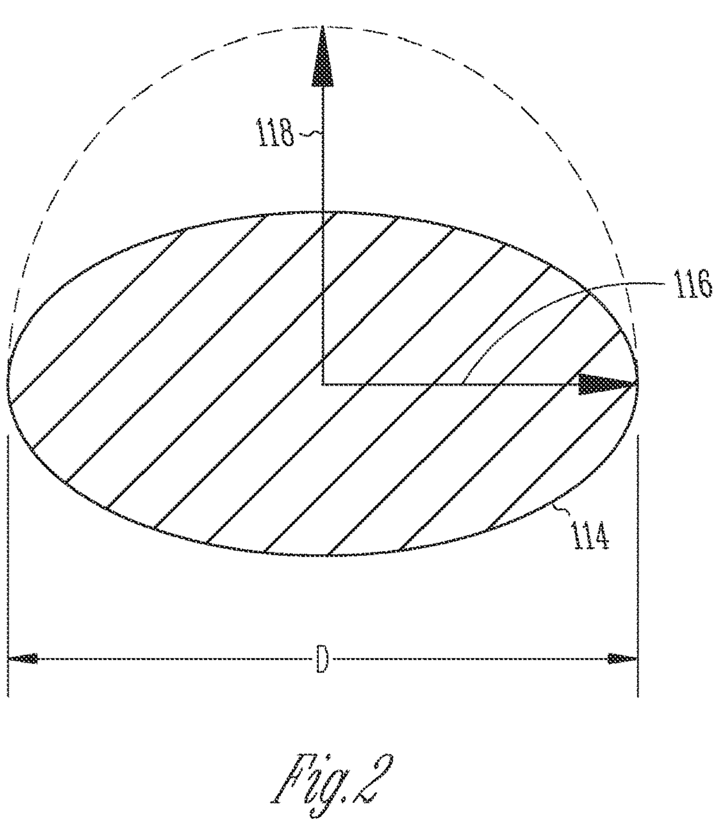
FIG. 2 is a perspective view of a solder bump on a pad of a connection surface, according to one or more embodiments.
Figure 3:
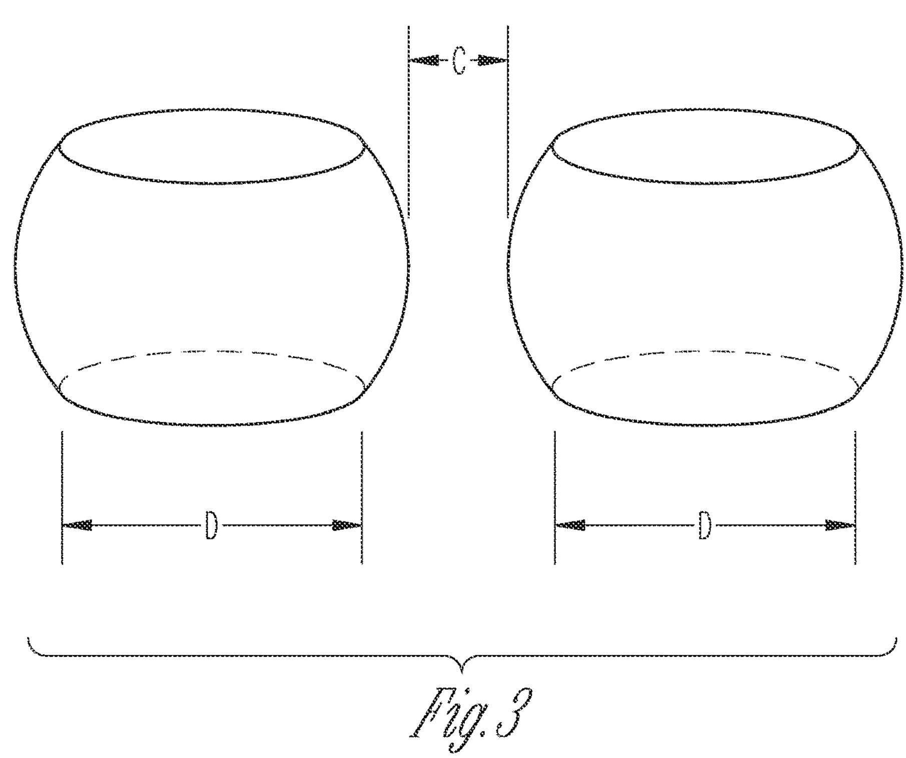
FIG. 3 is a side-by-side comparison of a two solder connections showing a contact area on a pad of a connection surface, a bulge amount, and a clearance between the connections, according to one or more embodiments.

With continued reference to FIG. 1, and as mentioned, the first plate-like element 102 may be a die. The die may include a silicon die manufactured using a photolithographic process, for example. The die may be configured to perform computing operations, for example. In one or more embodiments, the die may include a computer processing unit (CPU) or another processing component of a computing system. In one or more embodiments, the die may be a bridge die used to interconnect dies within a die package. In still other cases, the die may include a die package including various layers adapted for securing the die to a power supply or other board, for example. The first plate-like element 102 may include a connection surface 110 having an array of connection elements 106 arranged across the surface 110. The connection elements 106 may each be arranged at a pad 114 such as that shown in FIGS. 2 and 4A-4C. The pads 114 may be spaced apart from one another and may have a selected size adapted to control and/or avoid lateral contact between the connection elements during assembly. That is, for example as shown in FIG. 2, the pads 114 may define an isolated surface area such as a circular surface area. The circular surface area may include a surface area that is filled by a particular volume of solder, for example, in a liquid state. That is, during the assembly process, the semiconductor device may be heated to cause solder reflow (e.g., to place the solder in a liquid state where its shape is controlled by its surface tension). In this condition, a particular volume of solder may form a substantially hemispherical shape with a substantially circular contact area on the die and/or the substrate. This may define the size of the pad 114, for example, for a particular device. Alternatively, the volume of solder may be selected to fit the available pad size. As shown in FIG. 3, the spacing of the pads 114 may be selected to avoid contact and/or provide a selected clearance between the connecting elements when two hemispherical shapes are reflowed together forming a bulging connection element that remains within the pad 114 and avoids flowing beyond the pad 114, for example. Various array sizes, pad sizes, and spacings may be provided based on the density of the connection elements 106/108 and the variability in the flatness of the elements being connected and other manufacturing tolerances.

The second plate-like element 104 may be a board to which the die is being electrically and physically connected. In one or more embodiments, the board may be a power supply board, another die, a motherboard, or another component functioning to place the die in electrical communication with a power source and/or other components of a computing system, for example. Like the first plate-like element 102, the second plate-like element 104 may include a connection surface 112 having an array of connection elements 108 arranged across the surface. The array on the second plate-like element 104 may correspond to the array on the first plate-like element 102 to provide for alignment between connection elements 106/108 on the first and second plate-like elements 102/104. The connection elements 108 on the second plate-like element 104 may also be arranged at respective pads 114. The pad size and spacing on the second plate-like element 104 may correspond to the pad size and spacing of the first plate-like element 102 such that when the connection surfaces 110/112 of the first and second plate-like elements 102/104 are arranged facing one another, each connection element 106/108 aligns with a connection element 106/108 on the opposing connection surface 110/112.

Turning now to the connection elements 106/108, one or more types of connection elements may be provided. The particular combination of connection elements 106/108 may be selected to maximize the assembly window of the semiconductor device 100 thereby increasing manufacturing yield and/or allowing for fewer or more lenient tolerances on the first and/or second plate-like elements 102/104. As shown in FIG. 1, one side of the connection may include connection elements 106 in the form of solder bumps 107. That is, for example, the first plate-like element 102 may include an array of solder bumps 107 on the connection surface 110. The solder bumps 107 may be arranged on the pads 114 and may have a volume selected to fill the pad 114 when the solder is in a molten state.

Figures 4A, 4B, 4C, 5A, 5B, 5C:
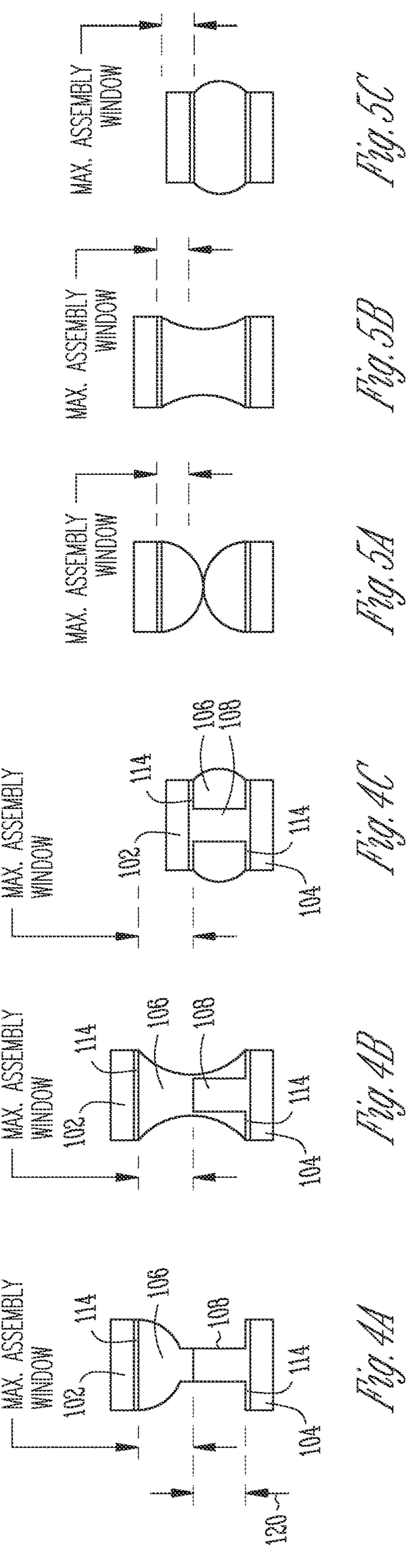
FIG. 4A is a cross-sectional view of a connection where a solder bump just touches an opposing solder cap on an elongate element, according to one or more embodiments.
FIG. 4B is a cross-sectional view of a connection where a solder bump has encompassed an opposing elongate element, according to one or more embodiments.
FIG. 4C is a cross-sectional view of a connection where an elongate element extends fully from a pad on a first connection surface to a pad on a second connection surface and solder encompasses the elongate element, according to one or more embodiments.
FIG. 5A is a cross-sectional view of two solder bumps just coming into contact.
FIG. 5B is a cross-sectional view of two solder bumps having merged into an hourglass shape.
FIG. 5C is a cross-sectional view of two solder bumps having merged into a bulging shape.

As also shown in FIG. 1, an opposing side of the connection may include connection elements 108 in the form of elongate elements 109 such as pillars, columns, slender cones, or other relatively tall slender elements. That is, the elongate elements 109 may be tall and slender as compared to the hemispherical shapes described with respect to molten solder. As shown in FIGS. 4A-4C, the elongate elements 109 may be arranged at or near a center of a respective pad 114 on the connection surface 112 of the die, substrate, or other plate-like element 104. The elongate elements 109 may also have a cross-sectional size (e.g., a diameter) that is smaller than the pad diameter. The elongate elements 109 may also have a height 120 selected to help increase the assembly window of the manufacturing process. That is, for example, the height 120 of the elongate element 109 may be at least as tall as the height of a single hemispherical solder bump that would otherwise fully occupy pad 114. It is noted, with reference to FIG. 2, that a radius 116 of the pad 114 is equal to the radius 118 of a hemisphere on the pad 114 and, as such, defines the height of the hemispherical shape. Accordingly, in one or more embodiments, the height 120 of the elongate element 109 may be greater than the radius 116 of the pad and, as such, greater than the height of the hemispherical shape otherwise filling the pad. In other embodiments, as shown by a comparison of FIG. 4A to 5C, the height 120 may be selected to be the full height of an otherwise fully merged pair of solder bumps having a bulging profile. This bulging solder height may be determined based on the surface tension of the solder material, the solder volume, the bump diameter and the bump pitch. In some embodiments, the elongate elements 109 may be still taller that such height. Still other heights 120 for the elongate element 109 may be used based on design requirements, anticipated warpage or flatness of the first and second plate-like elements and/or other design considerations.

While the solder bumps 107 have been said to be on the first plate-like element 102, the solder bumps 107 may, alternatively, be arranged on the second plate-like element 104. While the elongate elements 109 have been said to be on the second plate-like element 104, the elongate elements 109 may, alternatively, be arranged on the first plate-like element 102. Moreover, while each plate-like element 102/104 is shown as having either solder bumps 107 or elongate elements 109, a combination of bumps 107 and elongate elements 109 may be used on a given connection surface 110/112 where any given connection includes a combination of a solder bump 107 and an elongate element 109.

In addition to the geometrical differences between the elongate elements 109 and the solder bumps 107, the elongate elements may also include a material different from the solder bumps 107. That is, the elongate elements 109 may be adapted to substantially maintain their shape during the heating process of assembling the first and second plate-like elements 102/104. That is, the elongate elements 109 may soften, but may not go so far as to turn to a molten state where they may reflow like the solder bumps 107. In particular, the elongate elements 109 may include a material having a higher melting point than the solder bumps 107. In one or more embodiments, the elongate elements 109 may include a different solder, a solder alloy, or another material selected for a particular semiconductor application that has a melting point higher than the solder bumps 107. In one or more embodiments, the elongate elements 109 may be adapted to maintain substantial rigidity during the heating and compression process of thermal compression bonding, for example. The elongate elements may include copper, nickel, iron, cobalt, nickel-iron, nickel-cobalt, iron-cobalt, or other relatively hard materials. In other embodiments, the elongate elements 109 may be adapted to maintain their shape during heating, but to soften to be more malleable during the compression process, for example. The elongate element may include one or more solder alloys such as tin-silver, tin-lead, or other material compositions.

In one or more embodiments, the elongate elements 109 may be adapted to deform during the assembly process. For example, and with reference to FIG. 6A, the elongate elements 109 may have a pre-assembled height 122 exceeding a fully merged pair of solder bumps having a bulging profile. However, deformation may occur during assembly causing the elongate element 109 to have a post-assembled height 124 shorter than the pre-assembled height 122. In this embodiment, the elongate element 109 may provide for a successful connection where a wider gap occurs between the first and second plate-like elements 102/104 but may still allow for a narrower gap as if the elongate element was a hard stop material with a height equal to the fully merged pair of solder bumps with a bulging profile. With continued reference to FIG. 6A, the elongate element may be a pillar, column, or other elongate element having a relatively soft composition such that the pillar, column, or other elongate element may deform during the assembly process. For example, in a thermal compression bonding process, the elongate element 109 may become soft without reflowing like the solder bumps 107, but may allow the compression from the process to compress and shorten the elongate element from a pre-assembled height to a post-assembled height. The post-assembled height may be evident due to rippling, visual surface stress marks, barreling, bent grain structures in the metal, flow patterns in the material, work hardening, or other deformation signs 130 on the elongate element 109. In one or more embodiments, force sensors or distance sensors may be provided to control the amount of compression and/or the amount of reduction in height that occurs during the process. That is, in one or more embodiments, the compression may be limited by limiting to a particular compressive force. In other embodiments, the compression may be limited by limiting how much the elongate element 109 will be shortened.

Figures 6A, 6B:
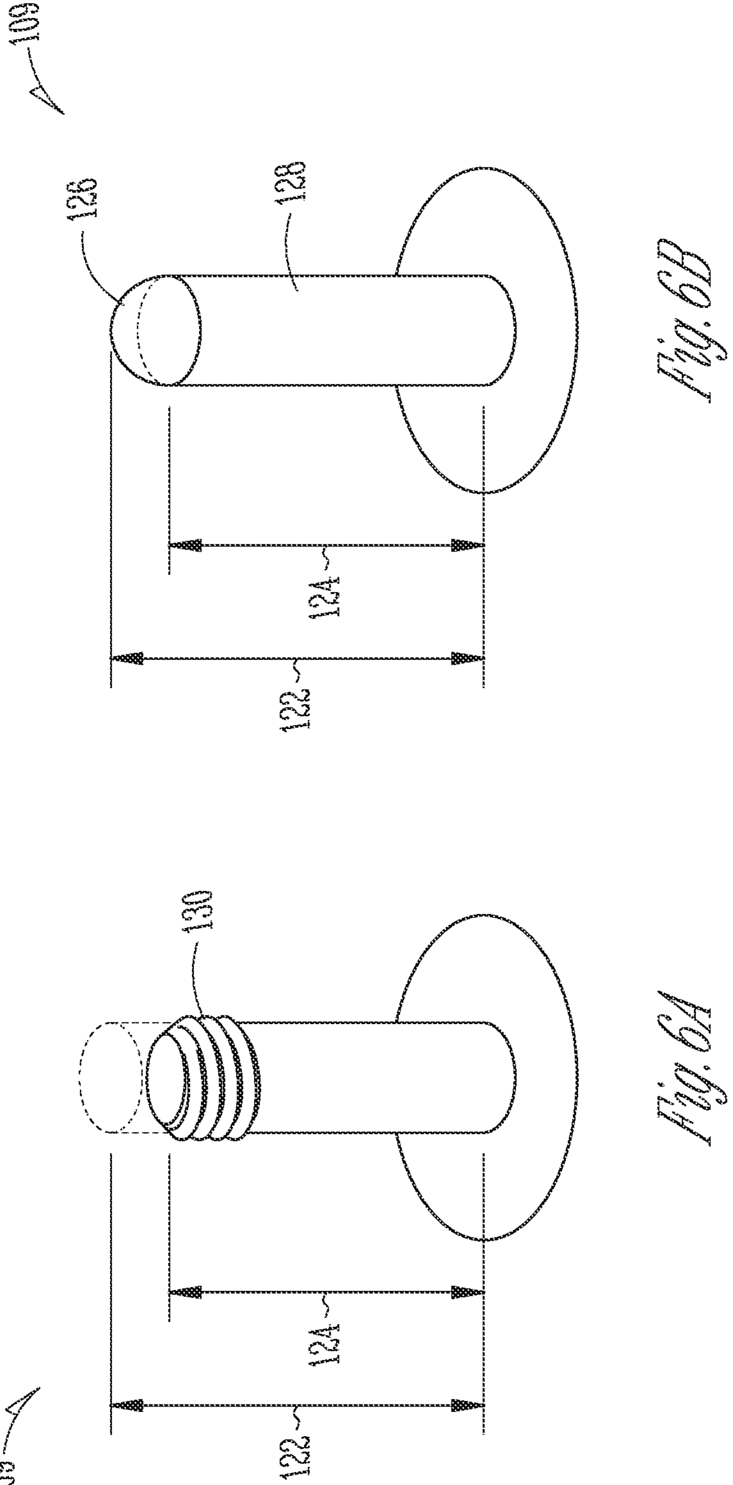
FIG. 6A is a perspective view of a deformable elongate element, according to one or more embodiments.
FIG. 6B is a perspective view of another deformable elongate element including a pillar portion and a solder cap, according to one or more embodiments.
Figure 7:
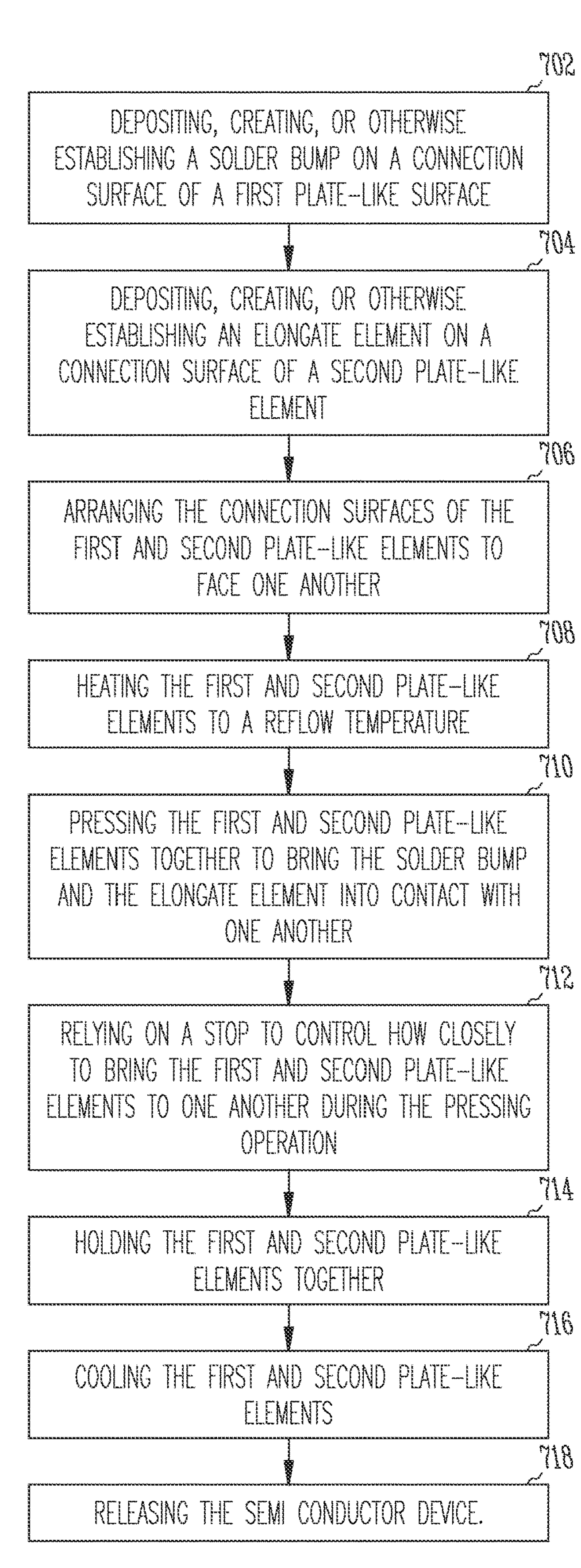
FIG. 7 is a diagram depicting a method of manufacturing an electronic connection, according to one or more embodiments.

Another approach to providing a deformable elongate element may include topping the elongate element 109 with a cap 126. That is, the elongate element may include a pillar, column, or other elongate portion 128 made of a relatively hard (e.g., as compared to the solder bumps 107) material and/or a material having a higher melting point than the solder bumps 107. The cap 126 may include a solder that has material properties similar to the solder bumps 107 and has a volume selected to fill the top of the elongate element without extending over the sides of the pillar in a molten state. That is, the volume of solder may be selected in similar fashion as the volume of solder relative to the size of the pads on the first and second plate-like elements 102/104. However, rather than using a size of the pad 114, the cross-section or diameter of the elongate portion 128 may be used. For example, a volume of solder that may establish a hemispherical formation on the top of the pillar or column in a molten state may be selected as shown in FIG. 6B.

In this embodiment, the elongate element 109 may include a pre-assembled height 122 equal to the height of the elongate portion 128 and the height of the cap 126. However, in a post-assembled state, the height 124 of the elongate element may depend on a distance between the connection surfaces of the first and second plate-like elements 102/104. That is, in one or more embodiments, the solder reflow process during assembly may cause the cap 126 and an opposing solder bump 107 to form a shape similar to that shown in FIG. 4A (e.g., a wine glass or goblet shape). The deformation of this elongate element, post-assembly, may be evident because the distance from the top of the pillar to the upper plate-like element may exceed the pad radius and, as such, the reflowed height of the solder bump 107. That is, if the distance from the top of the pillar to the upper plate-like element exceeds the pad radius, then without a cap having been on the pillar, pre-assembly, the solder bump 107 would not have reached the pillar. In another embodiment, the solder reflow process during assembly may cause the cap 126 to merge with the opposing solder bump 107 and encompass the pillar 128, such that the post-assembled height 124 of the elongate element is equal to the height of the pillar 128 as shown in FIG. 4C. Other intermediate formations such as that shown in FIG. 4B may also result depending on the distance between the plate-like elements.

It is to be appreciated that while malleable pillars and pillars with caps 126 have been described as deformable options for the elongate element 109, a combination of both of these may also be used. Moreover, it is also to be appreciated that the total volume of pillar material, cap material, and opposing solder bump material may be selected to maintain the solder within the pad areas on the connection surfaces when the first and second plate-like elements are relatively close together as defined by the height of the pillar and/or a deformed pillar. Considerations for the surface tension of the solder may be used to establish suitable amounts of solder such that the solder may remain within the area of the pad.

In an assembled state, the first and second plate-like elements 102/104 may be connected by one or more connections between the respective connection elements 106/108 in their respective arrays. The resulting connection formation (e.g., between a solder bump 107 and a corresponding elongate element 109) may depend on the location of the connection and the deformations, warping, or other factors that affect the space between the first and second plate-like elements 102/104 at various locations. As shown in FIG. 4A, where warpage or other factors establish a large distance between the first and second plate-like elements 102/104, a solder bump 107 on the connection surface 110 of the first plate-like element 102 may just come into contact with the top of an elongate element 109 and/or a cap 126 on the top of the elongate element 109. On the other extreme where warpage or other factors establish a relatively small distance between the first and second plate-like elements 102/104, the solder bump 107 may flow more fully around the elongate element 109 and may bulge slightly while maintaining contact within no more of the connection surfaces 110/112 than the respective pads 114 on the first and second plate-like elements 102/104 as shown in FIG. 4C. In this condition, the elongate element 109 may extend the full distance between the first and second plate-like elements 102/104 and, as such, may function as a hard stop, for example, where the elongate element 109 may limit how close the first and second plate-like elements 102/104 are able to get at this location. As mentioned, where the elongate element 109 includes a deformable pillar, the pillar may allow for some amount of compressive deformation upon being contacted by the opposing surface. In other situations, as shown in FIG. 4B, the solder bump 107 may flow partially around the elongate element 109, but with a gap between the top of the elongate element 109 and the upper plate-like element 102, the solder bump 107 (and potentially the cap 126) may form an hour-glass type shape encompassing the elongate element 109. Still other resulting shapes may be provided. However, suitable shapes may include solder that remains within the area of the pads 114 on the first and second plate-like elements 102/104 and, together with the elongate element 109, establishes contact between the first and second plate-like elements 102/104.

It is to be appreciated that the elongate elements 109 may provide for a larger assembly window than is provided by systems having two opposing solder bumps. That is, as shown in FIG. 5A-5C, the variability in the flatness of the plate-like elements that may be accommodated by opposing solder bumps may be limited to the difference between two conditions. The first condition is a condition where the two opposing solder bumps just come into contact with one another. The second condition is a condition where the two opposing solder bumps have been compressed to a point where further compression would cause the contact area of the solder bulge to extend outward beyond the perimeter of the pad on the first and second plate-like elements. The difference in height of these two conditions establishes an assembly window. That is, where the relative flatness of the first and second plate-like elements combines in a way that falls outside of the assembly window, then either a non-contact open condition may occur or a short may occur.

The elongate elements 109 may function to increase the assembly window. In particular, the taller height of the elongate element 109 relative to a solder bump 107 helps to reach further toward the opposing connection surface 110/112 and establish a connection when the connection surfaces 110/112 are farther apart. However, the elongate element height and size may also be selected to accommodate the same or similar spacing between the first and second plate-like elements 102/104 as would occur when two solder bumps 107 were fully compressed but remain within their respective pads as shown in FIG. 4C. That is, the volume of the elongate element 109 may be selected to be the same or similar to the volume of a hemispherical solder bump 107 such that when combined with a hemispherical solder bump 107, the shape is the same or similar to two merged hemispherical solder bumps like those shown in FIG. 5C. In this way, the elongate element 109 may allow for larger gaps between the first and second plate-like elements 102/104 and may still allow for the narrower gap presently available. As mentioned above with respect to deformable pillars with caps 126, the volume of the cap 126 may also be taken into consideration when a solder cap 126 is present and either the opposing solder bump 107 or the volume of the pillar 128 (or both) may be adjusted such that the total material volume is the same or similar to two merged hemispherical solder bumps.

A method 700 of manufacturing of the semiconductor device may also be provided. For example, the method may include depositing, creating, or otherwise establishing a solder bump on a connection surface of a first plate-like surface 702. The method may also include depositing, creating, or otherwise establishing an elongate element on a connection surface of a second plate-like element in a position corresponding to the position of the solder bump on the first plate-like element 704. That is, the position corresponding to the solder bump may include a position on the second plate-like element that aligns with the solder bump when the first and second plate-like elements are arranged with their connection surfaces facing one another and the first and second plate-like element are aligned based on other assembly factors. The elongate element may include a relatively hard pillar, a malleable pillar (e.g. deformable by the thermal compression bonding process), and/or a hard or malleable pillar with a cap. The method may also include arranging the connection surfaces of the first and second plate-like elements to face one another 706. The method may also include heating the first and second plate-like elements to a reflow temperature or a temperature causing the solder bump and any caps to turn from a solid state to a liquid or molten state 708. The method may also include pressing the first and second plate-like elements together to bring the solder bump and the elongate element and/or cap thereon into contact with one another 710. The method may also include relying on a stop to control how closely to bring the first and second plate-like elements to one another during the pressing operation 712. In one or more embodiments, the stop may include the elongate element. That is, the first and second plate-like elements may be pressed together until the elongate element on one of the first and second plate-like elements contacts the connection surface of the other of the first and second plate-like elements. The method may also include holding the first and second plate-like elements together 714 and cooling the first and second plate-like elements 716. The method may also include releasing the semiconductor device 718. It is to be appreciated that depending on what is being used as a stop (e.g., the solder, an elongate element, or some other stop), the heating of the plate-like elements may occur before or after the pressing operations. That is, in some instances, the solder bumps or cap, for example, may be used as a stop and, in these circumstances, heating may occur after the plate-like elements are pressed together to find the stopping point. However, where other stops are used (e.g., hard or malleable pillars with a higher melting point than the solder bumps and caps) that are not turned to liquid by the heating process, the heating may occur before the pressing operation. In still other situations a force sensor may be used where pressing of the first-second plates together stops when a predetermined force is reached. Where deformable elongate elements are provided, the predetermined force may be selected to provide a selected amount of deformation. Alternatively or additionally, a predetermined distance of deformation may also be used. Still other orders of the steps mentioned may be used.

In one or more embodiments, the method may include batch processes where several dies, for example, are plated or assembled onto a shared substrate or onto separate substrates, but using a single or simultaneous batch process. The variability in the plate-like elements across the batch may have a tendency to increase the variability in the system, which may include issues of co-planarity. That is, where a substrate is tipped or otherwise is not arranged with a horizontal connection surface and the die is arranged horizontally, even though both are relatively flat, the connection surfaces may end up relatively close together or relatively far apart depending on their position. In these circumstances, the elongate element may function as a hard stop to bring the die into planar alignment with the substrate to allow for a suitable connection. This is one circumstance where a factor other than warpage, for example, may be addressed by the present connection technique or system. This co-planarity issue may also be seen in single dies being assembled on a substrate and is not only seen with multiple dies. In either case, the rigid pillars may function as a hard stop to bring the die/substrate into a co-planar arrangement. This may allow for a self-coplanarity adjustment or an auto co-planarity adjustment, for example.

Figure 8:
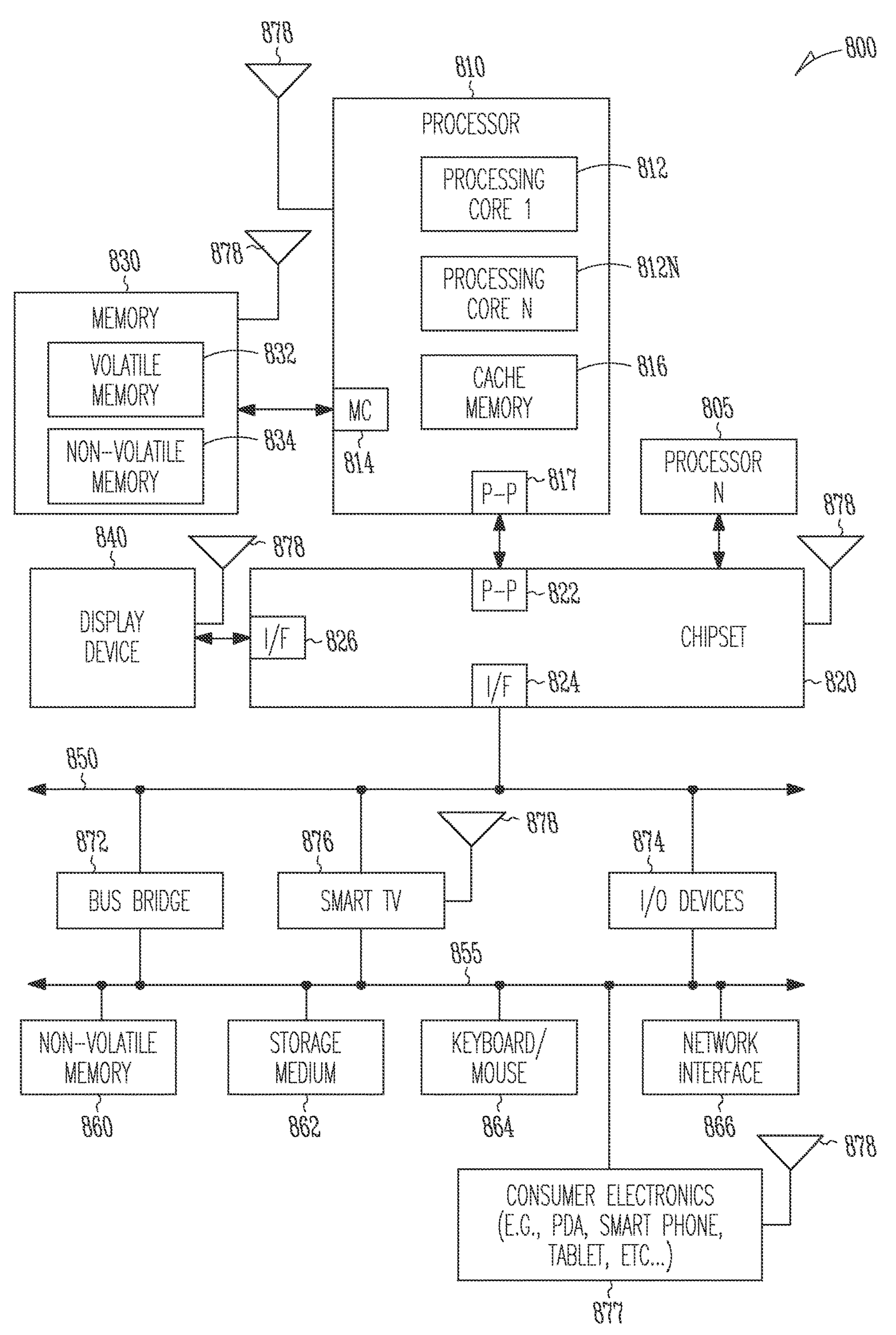
FIG. 8 is a system diagram depicting a system having an electronic device with an electronic connection, according to one or more embodiments.

FIG. 8 illustrates a system level diagram, depicting an example of an electronic device (e.g., system) that may include a semiconductor device such as the device above and/or a semiconductor device manufactured using one or more of the methods described above. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 includes a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices) 862, a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals. In one example, any combination of components in a chipset may be separated by a continuous flexible shield as described in the present disclosure.

Chipset 820 connects to display device 840 via interface 826. Display 840 may be, for example, a liquid crystal display (LCD), a light emitting diode (LED) array, an organic light emitting diode (OLED) array, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

To better illustrate the method and apparatuses disclosed herein, a non-limiting list of embodiments is provided here:

Example 1 includes a semiconductor device comprising a first plate-like element having a first substantially planar connection surface with a first connection pad, a second plate-like element having a second substantially planar connection surface with a second connection pad corresponding to the first connection pad, and a connection electrically and physically coupling the first and second plate-like elements and arranged between the first and second connection pads. The connection may include a deformed elongate element arranged on the first connection pad and extending toward the second connection pad and solder in contact with the second connection pad and the elongate element.

Example 2 includes the semiconductor device of example 1, wherein the deformed elongate element comprises a pillar, the solder is arranged on a pad with a radius, and a distance from the second connection pad to the pillar is greater than the radius.

Example 3 includes the semiconductor device of any one of examples 1-2, where the deformed elongate element comprises deformation signs.

Example 4 includes the semiconductor device of any one of examples 1-3, wherein a volume of the elongate element is the same as a volume of the solder.

Example 5 includes the semiconductor device of any one of examples 1-4, wherein a diameter of the elongate element is smaller than a diameter of the first connection pad.

Example 6 includes the semiconductor device of any one of claims 1-5, the first connection pad and the second connection pad are circular pads defined by equal first and second radii, respectively, the deformed elongate element has a height, and the height is larger than each of the first and second radii.

Example 7 includes the semiconductor device of example 6, wherein the height is less than twice each of the first and second radii.

Example 8 includes the semiconductor device of any one of examples 1-7, wherein the solder comprises a first solder material and the elongate element comprises a second solder material having a melting point higher than the first solder material.

Example 9 includes the semiconductor device of any one of examples 1-8, wherein the first or second plate-like element comprises a die.

Example 10 includes the semiconductor device of any one of examples 1-9, wherein the first or second plate-like element comprises a bridge die.

Example 11 includes an electronic system, comprising a first plate-like element having a first substantially planar connection surface with a first connection pad, a second plate-like element having a second substantially planar connection surface with a second connection pad corresponding to the first connection pad, a connection electrically and physically coupling the first and second plate-like elements and arranged between the first and second connection pads, and an electrical component electrically coupled to the first plate-like element. The connection includes a deformed elongate element arranged on the first connection pad and extending to the second connection pad and a solder in contact with the second connection pad and the elongate element.

Example 12 includes the electronic system of example 11 wherein the electrical component comprises an antenna.

Example 13 includes the electronic system of any one of examples 11-12, wherein the electrical component further comprises a touch screen.

Example 14 includes the electronic system of any one of examples 11-13, wherein the electrical component further comprises a personal computer.

Example 15 includes the electronic system of any one of examples 11-14, wherein the deformed elongate element comprises a pillar, the solder is arranged on a pad with a radius, a distance from the second connection pad to the pillar is greater than the radius.

Example 16 includes the electronic system of any one of examples 11-15, wherein the deformed elongate element comprises deformation signs.

Example 17 includes the electronic system of any one of examples 11-16, wherein a volume of the deformed elongate element is the same as a volume of the solder.

Example 18 includes a method of assembling a semiconductor device, comprising heating first and second plate-like elements to a solder reflow temperature, pressing the first plate-like element against the second plate-like element until deformation occurs to an elongate element extending from a first connection pad on the first plate-like element toward a second connection pad on the second plate-like element.

Example 19 includes the method of example 18, wherein a preassembled height of the elongate element comprises a pillar and a solder cap and deformation occurs due to the pressing step forcing the solder cap to reflow.

Example 20 includes the method of any one of examples 18-19, wherein the preassembled height of the elongate element comprises a pillar and the pressing comprises pressing the first plate-like element until the elongate element contacts the second connection pad and continuing to press until a selected compression limit is reached.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

What is claimed is:

1. A semiconductor device, comprising:

a first plate-like element having a first substantially planar connection surface with a first connection pad;

a second plate-like element having a second substantially planar connection surface with a second connection pad corresponding to the first connection pad; and a connection electrically and physically coupling the first and second plate-like elements and arranged between the first and second connection pads, comprising:

a deformed elongate element arranged on the first connection pad and extending toward the second connection pad; and solder in contact with the second connection pad and the elongate element wherein a melting point of the elongate element is higher than the solder and the elongate element does not comprise solder.

2. The semiconductor device of claim 1, wherein:

the deformed elongate element comprises a pillar; and a distance from the second connection pad to the pillar is greater than a radius of the second connection pad.

3. The semiconductor device of claim 1, wherein the deformed elongate element comprises deformation signs.

4. The semiconductor device of claim 1, wherein a volume of the elongate element is the same as a volume of the solder.

5. The semiconductor device of claim 1, wherein a diameter of the elongate element is smaller than a diameter of the first connection pad.

6. The semiconductor device of claim 1, wherein the first connection pad and the second connection pad are circular pads defined by equal first and second radii, respectively, the deformed elongate element has a height, and the height is larger than each of the first and second radii.

7. The semiconductor device of claim 6, wherein the height is less than twice each of the first and second radii.

8. The semiconductor device of claim 1, wherein the first or second plate-like element comprises a die.

9. The semiconductor device of claim 1, wherein the first or second plate-like element comprises a bridge die.

10. The semiconductor device of claim 3, wherein the deformation signs comprise one or more of rippling in the elongate element, stress marks in the in the elongate element, barreling in the elongate element, bent grain structures in the elongate element, flow patterns in the elongate element material, and work hardening in the elongate element.

11. An electronic system, comprising:

a first plate-like element having a first substantially planar connection surface with a first connection pad;

a second plate-like element having a second substantially planar connection surface with a second connection pad corresponding to the first connection pad;

a connection electrically and physically coupling the first and second plate-like elements and arranged between the first and second connection pads, comprising:

a deformed elongate element arranged on the first connection pad and extending to the second connection pad; and solder in contact with the second connection pad and the elongate element, and an electrical component electrically coupled to the first plate-like element;

wherein a melting point of the elongate element is higher than the solder and the elongate element does not comprise solder.

12. The system of claim 11, wherein the electrical component comprises an antenna.

13. The system of claim 12, wherein the electrical component further comprises a touch screen.

14. The system of claim 11, wherein the electrical component further comprises a personal computer.

15. The system of claim 11, wherein:

the deformed elongate element comprises a pillar;

the solder is arranged on a pad with a radius; and a distance from the second connection pad to the pillar is greater than the radius.

16. The system of claim 11, wherein the deformed elongate element comprises deformation signs.

17. The system of claim 11, wherein a volume of the deformed elongate element is the same as a volume of the solder.

18. A device, comprising:

a circuit board comprising first connection pads;

a die coupled to the circuit board and comprising second connection pads;

a plurality of elongate elements, each elongate element coupled to a respective first connection pad of the circuit board and extending toward a corresponding second connection pad of the die; and solder in contact with corresponding pairs of elongate elements and second connection pads, wherein a melting point of the elongate elements is higher than the solder and the elongate element does not comprise solder.

19. The device of claim 18, wherein:

the elongate elements comprise pillars; and a distance from the second connection pads to the pillars is greater than radii of the second connection pads.

20. The device of claim 18, wherein a diameter of the elongate element is smaller than a diameter of the first connection pad.

* * * * *